United States Patent [19]

Urban

[11] Patent Number: 4,796,795
[45] Date of Patent: Jan. 10, 1989

[54] FLUX FUME REMOVAL DEVICE

[75] Inventor: Paul Urban, Cheraw, S.C.

[73] Assignee: Cooper Industries, Inc., Houston, Tex.

[21] Appl. No.: 107,200

[22] Filed: Oct. 13, 1987

[51] Int. Cl.⁴ .............................................. B23K 3/00
[52] U.S. Cl. ........................................ 228/20; 228/57; 55/385.1
[58] Field of Search ............... 228/207, 223, 224, 20, 228/41, 42, 52, 57; 219/230; 202/185.1, 202; 196/138; 55/385 R

[56] References Cited

U.S. PATENT DOCUMENTS 3,411,594  11/1968  Siegel ........................... 228/20 HT
4,358,662  11/1982  Cranor et al. ................. 228/20 HT
4,607,151  8/1986   Kihlstrom ......................... 219/230

FOREIGN PATENT DOCUMENTS 6601198  8/1964  Netherlands ................. 228/20 HT Primary Examiner—Nicholas P. Godici
Assistant Examiner—Samuel M. Heinrich
Attorney, Agent, or Firm—Eddie E. Scott; Alan R. Thiele

[57] ABSTRACT

A flux fume removal device for series insertion in a vacuum line includes a housing which contains a duck bill valve to provide a pressure drop. After passing through the duck bill valve, the fumes then pass through a sponge which collects liquid flux.

6 Claims, 1 Drawing Sheet

U.S. Patent
Jan. 10, 1989
4,796,795
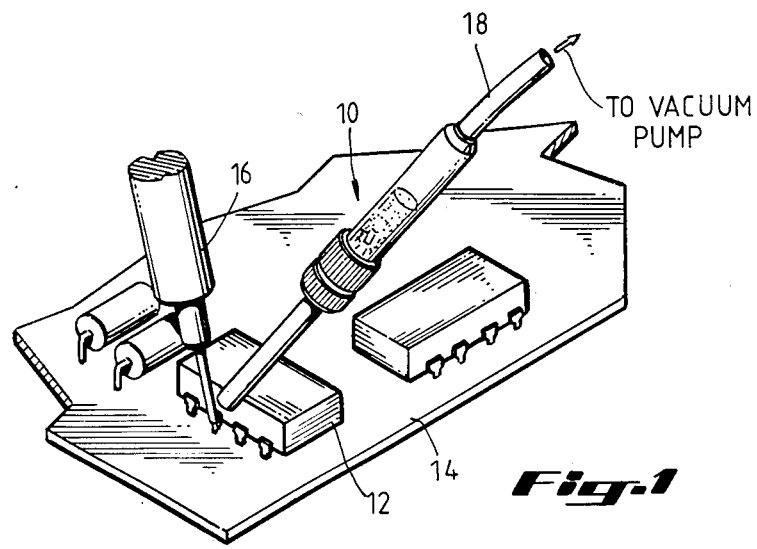
Fig. 1
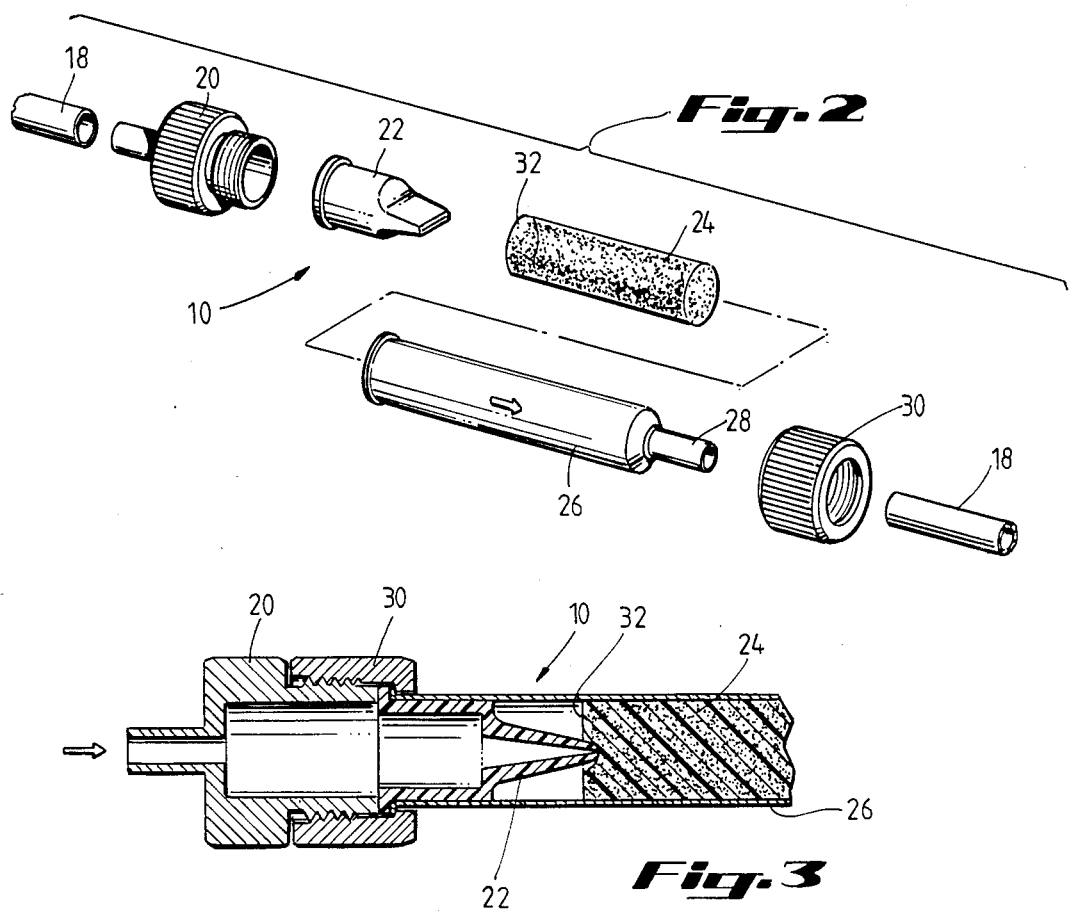
Fig. 2
Fig. 3

FLUX FUME REMOVAL DEVICE

BACKGROUND OF THE INVENTION

The present invention relates to vacuum systems for removing flux fumes from a soldering site. More particularly, the present invention relates to filters which are placed in vacuum lines which remove flux fumes from soldering sites.

Flux fume removal devices are commonly used, in the soldering of components to circuit broads. These flux fume removal devices include a tube and a vacuum pump. The tube provides a vacuum at the soldering site and the vacuum pump draws the flux fumes away from the soldering site through the tube.

Flux fumes consist of various chemicals which destroy electrical components and attack metals. To prevent these flux fumes from reaching the operating portions of the vacuum pump and damaging its operability, manufacturers have provided filters which generally contain plastic or other microporous material. These filters are designed to prevent the flux fumes from reaching the vacuum pump.

Several problems have been associated with prior art filters. Specifically, to be effective the porosity of materials employed had to be quite small. This small porosity restricted air flow which in turn hampered the removal of flux fumes from the soldering site. Additionally, the small porosity material tends to clog rapidly with condensed flux thus necessitating frequent replacement. In an effort to solve these problems, filters with larger cross-sectional areas have been used. Such filters, while somewhat more effective, are bulky and costly to manufacture.

There is therefore a need in the art to provide a small, inexpensive, easy-to-use filter which removes flux fumes from a vacuum air flow from a soldering site but does not need to be cleaned at frequent intervals.

There is also a need in the art to provide a flux fume removal device which is easily disassembled for proper cleaning. Such disassembly should displace the continuing replacement of flux fume removal filters.

SUMMARY OF THE INVENTION

A small, inexpensive, easy-to-clean and easy-to-use flux fume removal device for removing flux fumes from a soldering site is constructed for insertion in a vacuum line attached to a vacuum pump. The device includes a housing which allows for series insertion in a vacuum line. Flux fumes enter the housing and passing through a duck bill valve. The duck bill valve provides a pressure drop which causes the fumes to condense. After passing through the duck bill valve, the condensed droplets of liquid flux are collected by a sponge contained within the housing.

BRIEF DESCRIPTION OF THE DRAWINGS

A better understanding of the flux fume removal device of the present invention may be had by reference to the drawings wherein:

FIG. 1 is a perspective view of the flux fume removal device contained within a vacuum line;

FIG. 2 is an exploded perspective view of the flux fume removal device of the present invention; and FIG. 3 is a sectional view of the flux fume removal device shown in FIGS. 1 and 2.

BRIEF DESCRIPTION OF THE EMBODIMENTS

As may be seen in FIG. 1, the flux fume removal of the present invention device 10 is adapted for use in soldering operations. Exemplary of such soldering operations is the attachment of components 12 to a circuit board 14. Such soldering operations produce fumes as the soldering flux is vaporized by the heat of the soldering iron 16. Such fumes are harmful to the operators of the soldering iron and therefore it is therefore desirous to remove them from the soldering operation by a vacuum hose 18 attached to a vacuum pump (not shown). Flux fumes, if caused to flow through vacuum pumps, are harmful to pump components. Therefore, it is necessary to provide a device which will capture the flux fumes so that they will not damage the vacuum pump. When the flux fume removal device is full, it should be easy to disassemble and clean.

The construction of the flux fume removal device 10 of the present invention is shown best by FIGS. 2 and 3. Therein it may been seen that vacuum tube 18 eminating from the soldering operation is mated to a threaded fitting 20. Within fitting 20 is a duck bill valve 22. This duck bill valve 22 provides a pressure drop which causes the flux fumes from the soldering site to condense. Once the flux fumes have condensed, they are then caught by sponge 24.

A housing 26 is sized to contain both duct bill valve 22 and sponge 24. Vacuum line 18 is mated to a fitting 28 which is formed on the end of housing 26. A threaded female coupling 30 is used to hold housing 26 together in conjunction with fitting 20.

When flux fume removal device 10 is assembled, duck bill valve 22 engages bottom 32 of sponge 24 as shown in FIG. 3.

There is thereby provided by the flux fume removal device 10 of the present invention a simple, small, easy-to-use, inexpensive and easy-to-clean device for removing flux fumes from a soldering site.

Those of ordinary skill in the art will understand that various embodiments of the present invention may be made without departing from the scope of the appended claims.

I claim:

1. A flux fume removal device comprising:
   a housing constructed and arranged for series connection to a vacuum line;
   a duckbill valve located within said housing;
   means for collecting liquid flux located downstream from said duckbill valve, said means for collecting liquid flux also located within said housing.

2. The flux fume removal device as defined in claim 1 wherein said means for collecting liquid flux is a sponge.

3. A system for removing flux fumes from a soldering site comprising:
   vacuum pump;
   a tube for applying the vacuum from said vacuum pump to said soldering site;
   a flux fume removal device constructed and arranged for series connection to said tube including;
   a housing constructed and arranged for series connection to said tube;
   a duckbill valve located within said housing;
   means for collecting liquid flux located downstream from said duckbill valve, said means for collecting liquid flux also located within said housing.

4. The flux fume removal device as defined in claim 3 wherein said means for collecting liquid flux is a sponge.

5. A method for removing flux fumes from a soldering site comprising the steps of:

causing said flux fumes to flow into a tube by applying a vacuum through the tube to the soldering site;

causing said flux fumes to pass through a duckbill valve;

collecting condensed flux fumes.

6. The method as defined in claim 5, wherein said condensed flux fumes are collected by a sponge.

* * * * *